(12) United States Patent
Berner et al.

(10) Patent No.: US 10,602,083 B2
(45) Date of Patent: Mar. 24, 2020

(54) GLOBAL SHUTTER IN PIXEL FRAME MEMORY

(71) Applicant: Insightness AG, Zürich (CH)

(72) Inventors: Raphael Berner, Plan-les-Ouates (CH); Christian Brändli, Baden (CH)

(73) Assignee: Insightness AG, Zürich (CH)

( * ) Notice: Subject to any disclaimer, the term of this patent is extended or adjusted under 35 U.S.C. 154(b) by 0 days.

(21) Appl. No.: 15/858,450

(22) Filed: Dec. 29, 2017

(65) Prior Publication Data

US 2018/0191982 A1 Jul. 5, 2018

(30) Foreign Application Priority Data

Dec. 30, 2016 (CH) ................. 0160001764
Dec. 30, 2016 (CH) ................. 0160001765

(51) Int. Cl.
*H04N 5/335* (2011.01)
*H04N 5/3745* (2011.01)
*H04N 5/374* (2011.01)
*H04N 5/341* (2011.01)
*G01J 1/46* (2006.01)
*H04N 5/378* (2011.01)
*G06F 11/00* (2006.01)
*G06T 7/20* (2017.01)
*H04N 5/355* (2011.01)

(52) U.S. Cl.
CPC ............. *H04N 5/3355* (2013.01); *G01J 1/46* (2013.01); *G06F 11/004* (2013.01); *G06T 7/20* (2013.01); *H04N 5/341* (2013.01); *H04N 5/35518* (2013.01); *H04N 5/378* (2013.01); *H04N 5/3741* (2013.01); *H04N 5/3745* (2013.01); *H04N 5/37455* (2013.01); *G06F 2201/86* (2013.01); *G06F 2201/88* (2013.01)

(58) Field of Classification Search
CPC ....... H04N 5/355–3559; H04N 5/2351; H04N 3/155; H04N 3/1556; H04N 27/14609; H04N 5/3745–37455; H01L 27/14609
See application file for complete search history.

(56) References Cited

U.S. PATENT DOCUMENTS 5,107,103 A 4/1992 Gruss et al.
5,488,415 A 1/1996 Uno
(Continued)

FOREIGN PATENT DOCUMENTS

DE 101 25 307 8/2002
DE 103 01 598 3/2004
(Continued)

OTHER PUBLICATIONS

Brandli, C., et al., "A 240 x 180 130 dB 3 us Latency Global Shutter Spatiotemporal Vision Sensor," IEEE J. Solid-State Circuits, 49(10): 2333-2341 (2014).
(Continued)

*Primary Examiner* — Sinh Tran
*Assistant Examiner* — Selam T Gebriel
(74) *Attorney, Agent, or Firm* — HoustonHogle LLP

(57) ABSTRACT

In an image sensor, some pixels in an array contain a sampling circuit to sample the light intensity and a capacitor to store an analog value representing the intensity at that pixel. Alternatively, a group of pixel circuits will be equipped with such sampling and capacitor circuits. This allows simple redundancy-reducing computations with a relatively simple pixel architecture.

15 Claims, 18 Drawing Sheets

(56) References Cited

U.S. PATENT DOCUMENTS

| | | | |
|---|---|---|---|
| 6,253,161 | B1 | 6/2001 | Arias-Estrada |
| 6,624,849 | B1 | 9/2003 | Nomura |
| 7,728,269 | B2 | 6/2010 | Lichtsteiner et al. |
| 9,143,680 | B2 | 9/2015 | Lee et al. |
| 9,544,507 | B2 | 1/2017 | Serrano Gotarredona et al. |
| 9,631,974 | B2 | 4/2017 | Delbruck et al. |
| 9,693,001 | B2 | 6/2017 | Kim et al. |
| 9,739,660 | B2 | 8/2017 | Suh et al. |
| 2008/0135731 | A1 | 6/2008 | Lichtsteiner et al. |
| 2010/0182468 | A1* | 7/2010 | Posch .................. H04N 5/335 348/294 |
| 2014/0326854 | A1 | 11/2014 | Delbruck et al. |
| 2015/0069218 | A1 | 3/2015 | Cho et al. |
| 2015/0194454 | A1 | 7/2015 | Kim et al. |
| 2016/0078001 | A1 | 3/2016 | Wang et al. |
| 2016/0093273 | A1* | 3/2016 | Wang .................. G01S 3/781 345/428 |
| 2016/0227135 | A1 | 8/2016 | Matolin et al. |
| 2017/0033777 | A1* | 2/2017 | Kim .................. H03K 5/082 |
| 2017/0140509 | A1 | 5/2017 | Lee et al. |

FOREIGN PATENT DOCUMENTS

| | | |
|---|---|---|
| EP | 0 553 406 | 4/1997 |
| EP | 1 657 910 | 5/2006 |
| EP | 2 538 665 | 12/2012 |
| WO | WO 2007085942 | 8/2007 |
| WO | WO 2013092666 | 6/2013 |
| WO | WO 2015036592 | 3/2015 |
| WO | WO 2017149433 | 9/2017 |
| WO | WO 2017158483 | 9/2017 |
| WO | WO 2017174579 | 10/2017 |

OTHER PUBLICATIONS

Chi, Y.M., et al., "CMOS Camera with In-Pixel Temporal Change Detection and ADC," IEEE J. Solid-State Circuits, 42(10): 2187-2196 (2007).

Habibi, M., "A Low Power Smart CMOS Image Sensor for Surveillance Applications," Machine Vision and Image Processing (MVIP), 1-4 (2010).

International Search Report and Written Opinion of the International Searching Authority, dated Mar. 19, 2018, from International Application No. PCT/IB2017/058526, filed on Dec. 29, 2017. 17 pages.

Lichtsteiner, P., et al., "A 128×128 120 dB 15 μs Latency Asynchronous Temporal Contrast Vision Sensor," IEEE J. Solid-State Circuits, 43(2): 566-576 (2008).

Aizawa, K., et al., "On Sensor Image Compression," IEEE Trans. Circ. Sys. Video Tech., 7(3): 543-548 (1997).

Aizawa, K., et al., "Compuational Image Sensor for on Sensor Compression," IEEE Trans. Elec. Dev., 44(10): 1724-1730 (1997).

Delbruck, T., et al., "32-Bit Configurable Bias Current Generator with Sub-Off-Current Capability," Circuits and Systems (ISCAS), 1647-1650 (2010).

Kramer, J., "An On/Off Transient Imager with Event-Driven, Asyncronous Read-Out," IEEE, 165-168 (2002).

International Search Report and Written Opinion of the International Searching Authority, dated Mar. 19, 2018, from International Application No. PCT/IB2017/058528, filed on Dec. 29, 2017. 11 pages.

Ruedi, P.-F., et al., "A 128×128 Pixel 120-dB Dynamtic-Range Vision-Sensor Chip for Image Contrast and Orientation Extraction," IEEE J. Solid-State Circ., 38(12): 2325-2333 (2003).

International Search Report of the International Searching Authority, dated May 9, 2017, from International Application No. PCT/IB2017/051129, filed on Feb. 27, 2017. 5 pages.

Written Opinion of the International Searching Authority, dated May 9, 2017, from International Application No. PCT/IB2017/051129, filed on Feb. 27, 2017. 10 pages.

International Search Report of the International Searching Authority, dated May 29, 2017, from International Application No. PCT/IB2017/051421, filed on Mar. 10, 2017. 4 pages.

Written Opinion of the International Searching Authority, dated May 29, 2017, from International Application No. PCT/IB2017/051421, filed on Mar. 10, 2017. 9 pages.

Fu, Z., et al., "A 1.2mWCMOS Temporal-Difference Image Sensor for Sensor Networks," IEEE, 1064-1067 (2008).

\* cited by examiner

US 10,602,083 B2

GLOBAL SHUTTER IN PIXEL FRAME MEMORY

RELATED APPLICATIONS

This application claims priority to Swiss Provisional Patent Application No. CH20160001764, filed on 30 Dec. 2016, and Swiss Provisional Patent Application No. CH20160001765, filed on 30 Dec. 2016, both of which are incorporated herein by reference in their entirety.

BACKGROUND OF THE INVENTION

Digital imaging systems acquire data for each pixel (picture element) in an array of pixels, typically a two-dimensional array, by digitally converting the intensity of light impinging on the pixel into electrical voltage and storing its value in binary bits (e.g., 8 or 16 bits per pixel). The image data (or simply image) can be in grey or color scale (RGB, for example).

Machine or computer vision algorithms operating on image data from sensors (e.g., digital cameras) are key to a huge variety of innovations, such as autonomous driving, automated manufacturing, robotics, surveillance, interactive devices using augmented or virtual reality, and so forth.

For typical consumers, computer vision algorithms and display screens use image data for crisp still images and movies. For these purposes, although the data can be compressed, using formats such as jpeg, gif, mpeg or mp4, the primary goal of such compression is to compress data with minimal sacrifice of image quality. For high fidelity images, lossless compression is preferable to lossy compression. Similarly efficiency of vision algorithms operating on data must also preserve high image quality for consumer applications.

In contrast, for industrial machine vision applications—machine vision and computer vision are synonymous in this document—image quality is less important than for consumer applications. In many industrial applications, the first processing steps after image pre-processing are focused on reducing the redundancy in data. Even though these redundancy suppression algorithms amount to a form of data compression, they are different from compression algorithms for consumer applications where the aim is to sacrifice as little image quality as possible. The goal of the redundancy suppression steps in computer vision is to reduce the volume of data to what is actually needed to perform a needed task. Such redundancy suppression steps include color or orientation histograms or feature detection steps such as edge, corner or blob detection and description.

Having a complete digital image frame in memory and processing digital data pixel by pixel is usually a performance bottleneck for computer vision which is why using parallel architectures such as FPGAs, GPUs or dedicated visual processors (e.g., Movidius Myriad 2 or Microsoft HPU) often result in significant performance improvements.

SUMMARY THE INVENTION

While higher spatial resolution, meaning smaller more numerous pixels, due to improving hardware fabrication technology produces even sharper images and movies, other specifications (not high resolution) such as latency, system performance and power consumption are more important when it comes to machine visions apps.

The problem with existing pixel arrays is that they cannot perform simple redundancy-reducing computations or require very complicated pixel designs to do so.

One important achievement of the present invention is to mitigate, eliminate or make obsolete some of the disadvantages associated with existing pixel arrays.

According to the invention, preferably each or some pixels in an array contains a sampling circuit to sample the light intensity and a capacitor to store an analog value representing the intensity at that pixel. Alternatively, a group of pixel circuits will be equipped with such sampling and capacitor circuits.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
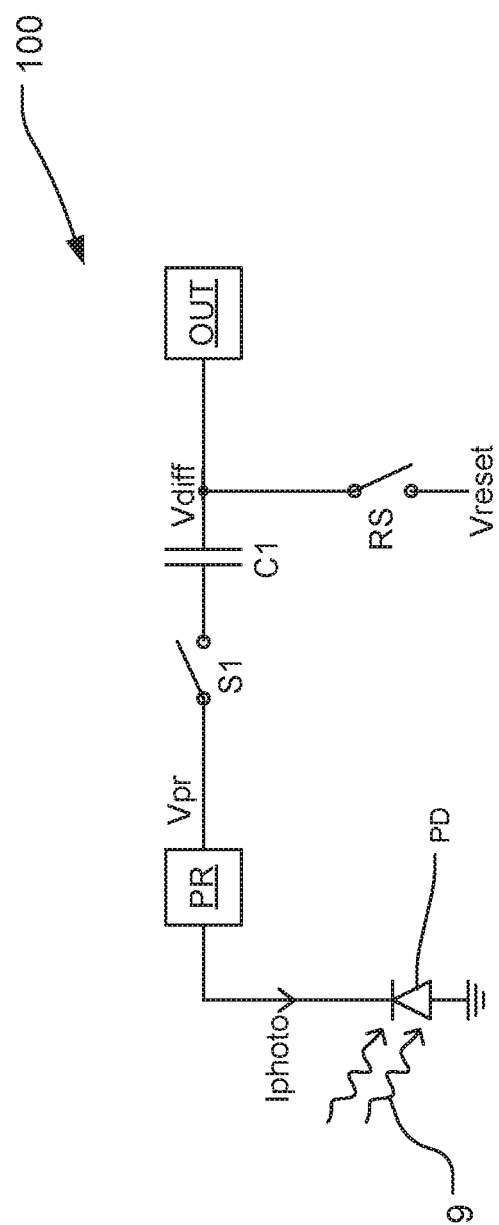
FIG. 1 is a circuit diagram showing the basic pixel circuit of a pixel used in a pixel array.

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

It will be understood that although terms such as "first" and "second" are used herein to describe various elements, these elements should not be limited by these terms. These terms are only used to distinguish one element from another element. Thus, an element discussed below could be termed a second element, and similarly, a second element may be termed a first element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A number of technical terms are used throughout the application. They are defined below for convenience and precise description of the invention.

Closed switch: A switch that is conducting, i.e., the two terminals are electrically connected.

Electronic connection: Connection between two nodes in a circuit, either direct (so that electric current can flow between the two nodes), or via a buffer.

Fixed pattern noise: Differences in photoreceptor voltages between pixels due to mismatch in circuit elements.

Motion artifact: A rolling shutter can exhibit a noticeable skew of would-be vertical lines in the image if either the camera or subject is moving quickly across the frame. The whole image can be warped if there is fast motion in the frame.

Open switch: A switch that is not conducting, i.e. an open circuit is provided between the two terminals.

Pixel address: A number or a pair of numbers describing the position of a pixel in the array. Usually a row number and a column number.

Power rail: Either ground (Vss) or the power supply (Vdd).

FIG. 1 illustrates a pixel circuit 100 according to an embodiment of the present invention.

In contrast to traditional definition of pixel as a picture element in an image such as that on a TV a screen, in this document a pixel is defined as a physical embodiment of a picture element along with the necessary electronics that enable its functionality. The term "pixel circuit" will be used when the discussion is focused on the electronics of the pixel. Otherwise, the term "pixel" will be used to denote the entire physical embodiment. A "pixel array" is defined as a collection of pixels. In principle a single pixel is a pixel array of one.

Coming back to FIG. 1, a pixel circuit comprises at least:

1. A photodiode that converts light 9 incident on the photodiode into a current (Iphoto or photocurrent). Its amplitude is proportional to the intensity of the light.

2. A photoreceptor (PR) is connected to the photodiode so that the photoreceptor can receive current Iphoto from the photodiode, and converts the current to a photoreceptor voltage Vpr. The relationship between Vpr to Iphoto is preferably logarithmic (as discussed below). But the relationship cab also be linear (i.e., proportional), or otherwise.

3. A capacitor (C1).

4. A sampling circuit that allows to connect the photoreceptor voltage to the first terminal of the capacitor using a sampling signal S1 shared among all pixels.

5. A reset circuit that allows connecting the second terminal of said capacitor to a reset voltage Vreset using a reset signal RS.

6. An output circuit OUT that allows reading said voltage at said second terminal of the capacitor.

The signal RS that is used to operate the reset circuit may depend on the voltage at the second terminal of the capacitor.

The capacitor C1 serves as an analog image frame memory that can be used for simple additive computations, while the first sampling circuit may act as a global shutter if it is operated simultaneously in all pixels of the pixel array.

The disclosed system trades spatial resolution for processing performance by adding an analog image memory to each pixel in a pixel array. The image memory (the capacitor C1) is configured in a way that it can compute basic, parallel computer vision redundancy suppression steps and thereby increase the system-level performance.

After performing the on-pixel computation the result is preferably communicated to the periphery of the pixel array from where it can be used for further computation or communicated to other ICs or devices.

Additionally the pixel array may comprise a global controller that can apply signals with the appropriate waveforms to control the sampling and reset circuits in the pixels.

Additionally the pixel array may further comprise a global readout circuit that can read voltages at nodes inside the pixels; preferably the readout circuit reads the voltage at the second terminal of the capacitor or an amplified version of this voltage. Preferably the readout circuit may encode the read voltages into digital numbers (either by using analog to digital converters, or by encoding the address of the pixel from which the voltage was read) and send the encoded voltages to a processor. Preferably the processor which receives the encoded voltages will run an algorithm to decode the encoded voltages which it received from the readout circuit and perform an algorithm to extract further information from the ensemble of encoded voltages.

Examples of the pixel circuit components, follow in FIGS. 2 through 10.

Figure 2:
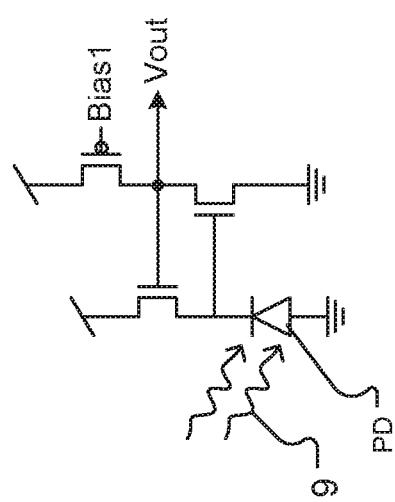
FIG. 2 is a circuit diagram showing a logarithmic photoreceptor that is preferably used in each pixel circuit.

FIG. 2 is an embodiment of logarithmic feedback photoreceptor. The photoreceptor (PR) converts the current Iphoto of the photodiode PD into a voltage Vpr that may be sampled by the frame memory. Depending on the embodiment of the invention and the according to computation performed by the pixel, different photoreceptors may be suitable.

Preferably the photoreceptor in each of the one or more pixels of any of the sensor embodiments is a logarithmic photoreceptor. A logarithmic photoreceptor is a photoreceptor which is configured to convert the Iphoto to a voltage that is proportional to the logarithm of the intensity of light impinging on the sensing surface of the pixel. Note although Vpr is chosen to be logarithmic in Iphoto, it could have been chosen to be proportional to Iphoto.

A logarithmic conversion from the current generated by the photodiode ("photocurrent") into the output voltage is very powerful because it allows mapping a wide range of input currents onto a limited voltage range. Comparing differences in the logarithmic intensity domain also has the advantage that it is mathematically similar to comparing normalized differences; most definitions of contrast are based on normalized differences (e.g., luminance ratio, Weber contrast or Michelson contrast). Comparing differences in the logarithmic intensity domain also allows observing differences in the reflectance of objects independent of the background illumination.

The following formula shows that differences in the logarithmic intensity domain result in the logarithm of the radiance ratio (which is similar to the luminance ratio, except that the luminance ratio is weighted with the sensitivity of the human eye). For a pixel x, Vprx=A log (Iphotox). Therefore, the difference between two pixels 1 and 2 is given by (Vpr1−Vpr2)=A log (Iphoto1)−A log (Iphoto2)=A log (Iphoto1/Iphoto2).

Preferably the logarithmic photoreceptor in a pixel or a group of pixels is implemented as a current domain feedback circuit with an NMOS transistor as feedback element. In this particular circuit, the photodiode voltage is amplified by a common source amplifier, whose output is connected to the gate of the feedback transistor that feeds the photocurrent to the photodiode. Due to the exponential relationship of gate voltage and the channel current in the sub-threshold operating regime of a transistor, such a feedback requires a logarithmic change in gate voltage to compensate for a linear increase in photocurrent.

The log feedback photoreceptor does not require any off-pixel (external to pixel) signals or integration time for its conversion which allows sampling its output at any moment in time. A disadvantage of the log feedback photoreceptor is the high fixed pattern noise on its output which makes it unsuited for pixel-to-pixel comparisons. Therefore, the log feedback receptor is ideally suited for temporal contrast computations (pixel comparisons of one frame with corresponding pixel of another frame).

Figure 3:
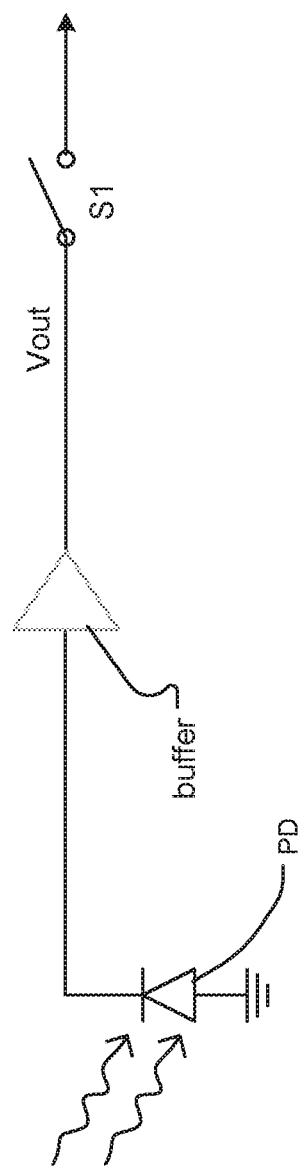
FIG. 3 is a circuit diagram showing an alternative photoreceptor for a pixel circuit.

FIG. 3 is an embodiment of solar cell photoreceptor with an optional buffer. The one or more pixels of any of the pixel array embodiments of the present invention may comprise a photodiode operated in solar cell mode. A photodiode operated in solar cell mode has a logarithmic intensity to voltage relation and is thus an alternative photoreceptor option. Either the photodiode is connected directly to the sampling switch, or via a buffer. A buffer allows faster operation because it reduces the capacitance that the photocurrent must charge, but also introduces mismatch and potentially also offset if a source follower buffer is used.

Pixels need to be reset once the data has been read out. While the sampling of the photoreceptor output Vpr onto the first terminal of the capacitor C1 preferably occur for all the pixels at the same time to avoid motion artifacts, this is not necessary for the second terminal, i.e. the reset of the pixel. See FIG. 1 where closing the RS switch applies Vreset. The reset of the pixel may either occur for all pixels in parallel (global reset) or depend on the output of the pixel (conditional reset).

The global reset allows computing changes within a specific time window while the conditional reset allows detecting specific amounts of change in a pixel independent of the time it takes for them to occur.

Figure 4:
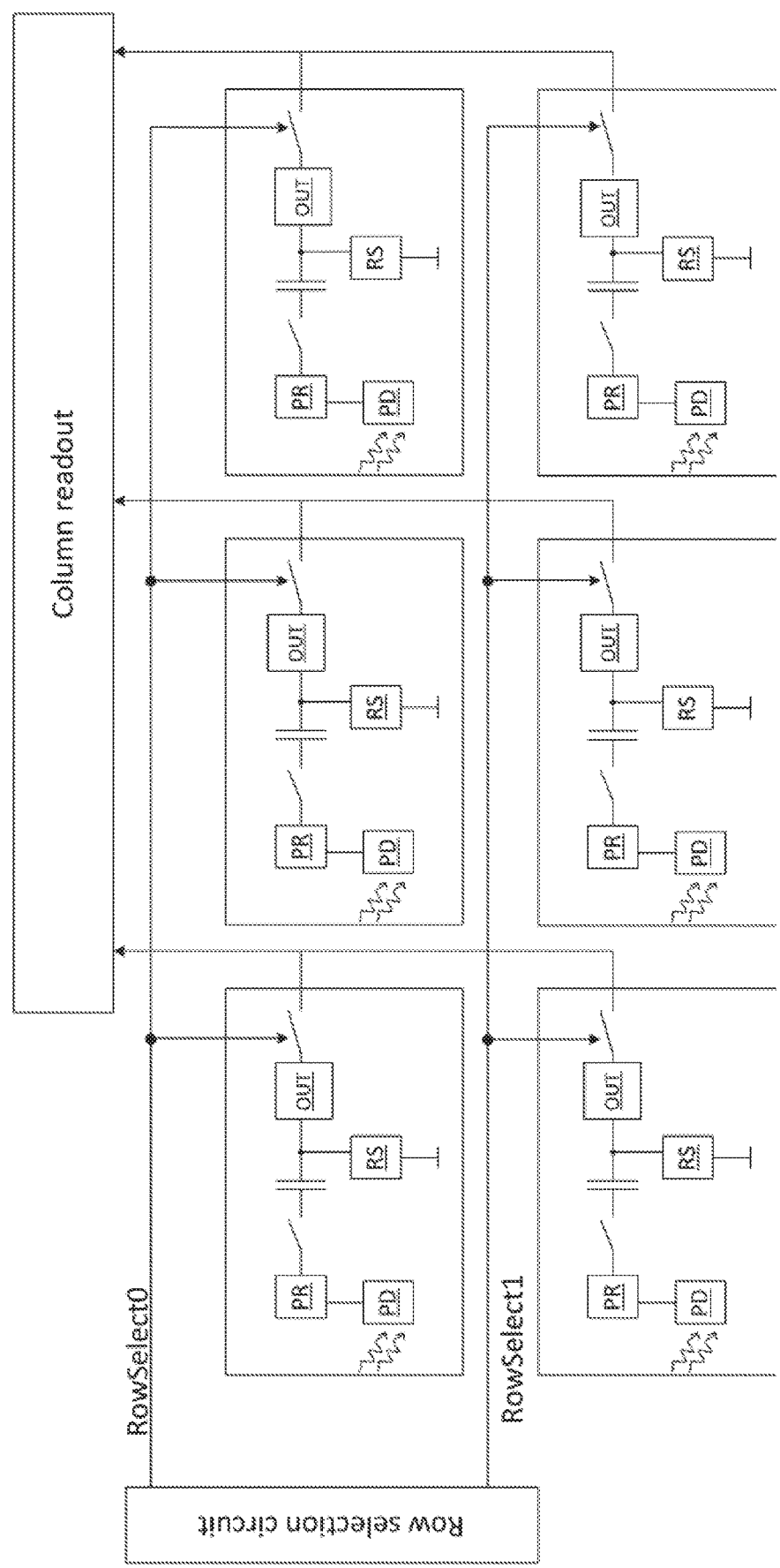
FIG. 4 is a schematic diagram showing a pixel array of a sensor with a basic readout circuit.

Referring to FIG. 4 which shows a pixel array according to the present invention, each pixel is connected to row select circuit and a basic column readout (RO) circuit. The row select circuit and a column readout circuit together define the readout circuit.

The readout circuit may read digital or analog voltages from the pixels. In case of analog readout, the readout circuit reads the analog voltage (or an amplified version of it) of the second terminal OUT of the capacitor. These analog voltages may then be converted to digital numbers by means of analog-to-digital converters, so that a full frame image may be acquired. In the case of temporal contrast computation, it would give an image of the changes since the last reference frame has been taken.

To fully leverage the advantages of the on-pixel computation it is preferable to read the pixel output in a digital, address-encoding manner.

Common to both analog and digital readout is that the data from the pixel is read row-wise. This means there is a row selection circuit whose output is a set of RowSelect signals. At each moment in time, preferably, at most one of the RowSelect signals is active. A row selection circuit may be implemented using a shift register.

When a RowSelect signal is active, all pixels in this row have their outputs connected to the column readout circuit. The column readout circuit design differs whether the readout is analog or digital.

Figure 5:
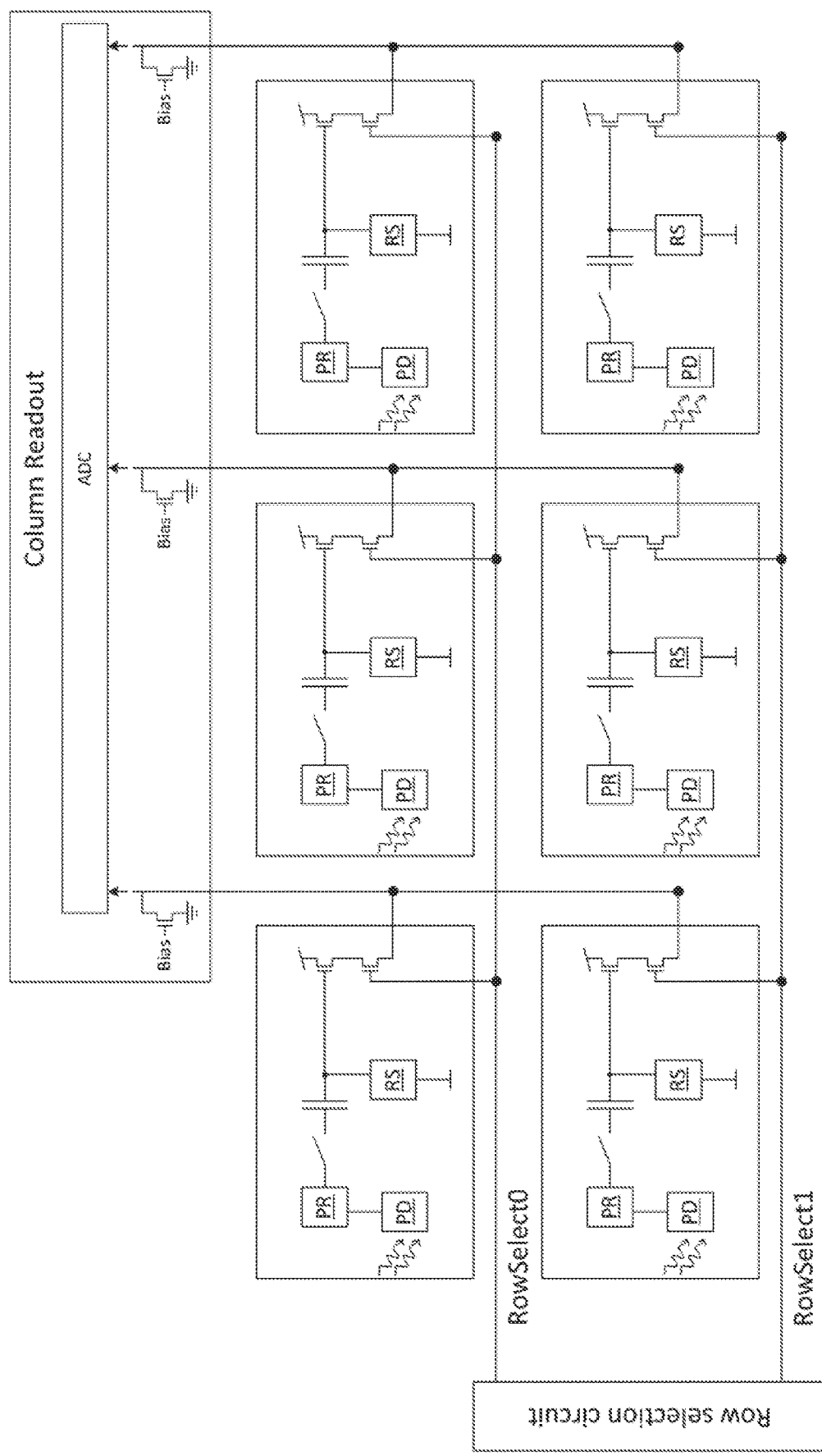
FIG. 5 is a schematic diagram showing a pixel array of a sensor with a readout circuit that reads analog voltages from each pixel.

Analog readout method is implemented as shown in FIG. 5 which shows a pixel array according to the present invention. In the figure each pixel is connected to row select circuit and a column readout circuit. Each pixel is connected to the column readout by means of a buffer which may be implemented as a source follower that can be enabled by means of a RowSelect signal.

One possible way to read out the on-pixel values of the memory or the resulting on-pixel computation comprise an on-pixel amplifier or buffer which may be addressed in a scanning manner similar to conventional image sensors. The output may then be routed to a single or multiple column-parallel analog to digital converters. The simplest analog readout of a pixel would be performed by a source follower circuit.

In case of analog readout, the column readout contains one or more analog-to-digital converters.

Figure 6:
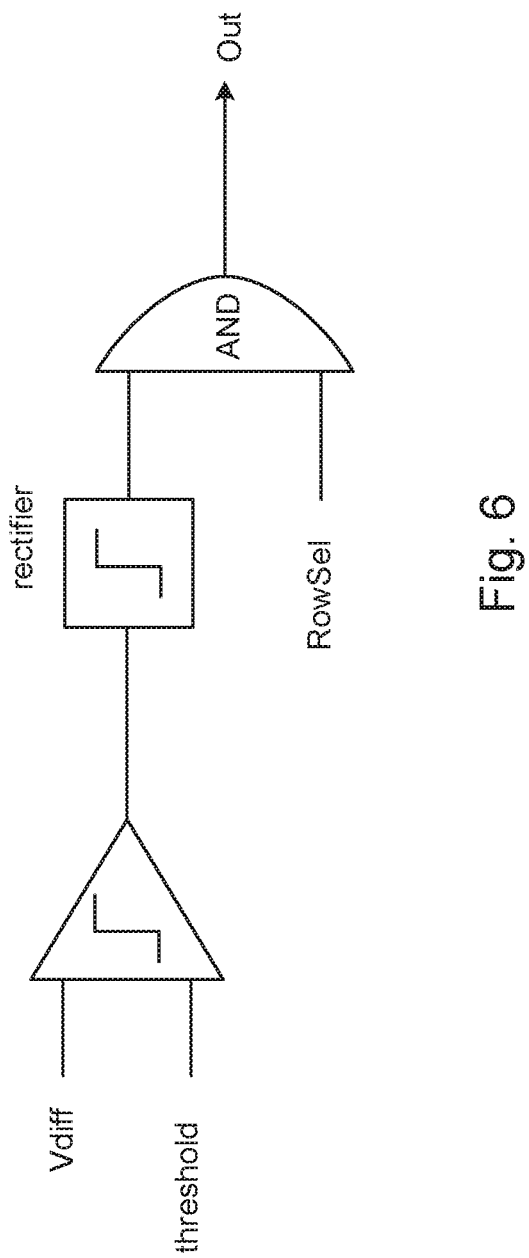
FIG. 6 is a circuit diagram showing a readout circuit that is preferably used for readout in each pixel circuit.

Digital readout in-pixel circuitry is shown in FIG. 6. Instead of reading the analog output voltages of all pixels, in-circuit pixel comparators may be used to convert these voltages to digital signals. Depending on the computation performed in the pixel, this readout is desirable because it allows to significantly compress the output and thus reduce the amount of data to transfer and process. Particularly in embodiments where the on-pixel circuit memory is used for redundancy suppression, a digital output is desirable.

As shown in FIG. 6, for a pixel with a digital readout, the circuit contains a comparator and an AND-gate with two inputs, namely the output of the comparator and a RowSel signal from the row selection circuit. The circuit optionally may have a rectifier between the comparator and the AND-gate if the comparator does not output fully digital signals.

The voltage Vdiff (the voltage at the second terminal of the capacitor) is compared to a threshold by means of a comparator. For readout speed this comparator is located in the pixel which allows to settle the digital output before addressing the pixel for readout. For digital readout, preferably the readout circuit reads the comparator outputs for all pixels and sends a ternary image (increase, decrease or no change) to the receiver for each frame.

Figure 7:
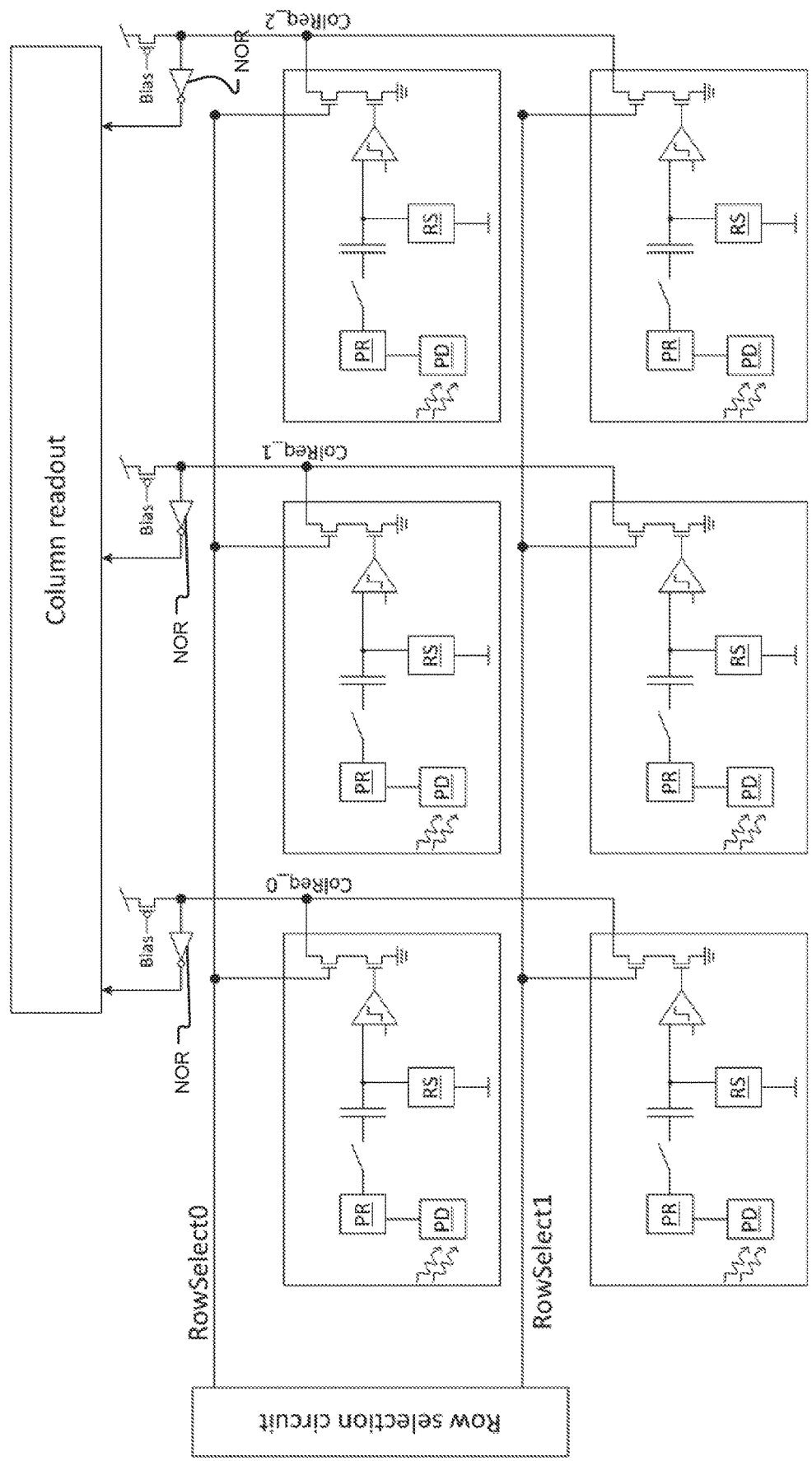
FIG. 7 is a schematic diagram showing a pixel circuit with digital readout for a sensor.

FIG. 7 shows a pixel array where each pixel is connected to row select circuit and a column readout circuit. Each pixel is connected to the column readout by means of a wired-NOR circuit that can be enabled by means of a RowSelect signal.

A compact implementation of the digital readout is, for example, a wired NOR circuit for each column of pixels as shown in FIG. 7. The row selection circuit sets the RowSelect signal high for one row of pixels. In this row, all pixels where the comparator output is high will be able to pull down the corresponding ColReq_x line, because both NFETs in the pixel are conducting. In those columns where in all pixels either the comparator output or the RowSelect signal is low, the PFET bias transistor will keep the corresponding line at the power supply. The AND-gate for each pixel is formed by the two NFET transistors, the PFET bias transistor and the inverter.

For most machine vision applications where pixel arrays collect data at different time instances, the digital readout of the proposed pixel array creates a sparse representation of the image data, meaning usually only a small percentage of the pixels cross the threshold, defined below.

Sparse digital signals can easily be further compressed using address-encoding of digital readout. A popular methodology for compressing sparse multidimensional digital data is to encode the coordinates or addresses (row number and column number) of the active pixels as a set of addresses. This encoding of digital events is also known as event-based readout. A popular encoding scheme in event-based vision sensors is to encode digital signals as tuples of addresses and timestamps whereas the address in most cases contains the row and column coordinates of the pixel and potentially further information such as the sign of a change (also known as polarity).

Figure 8:
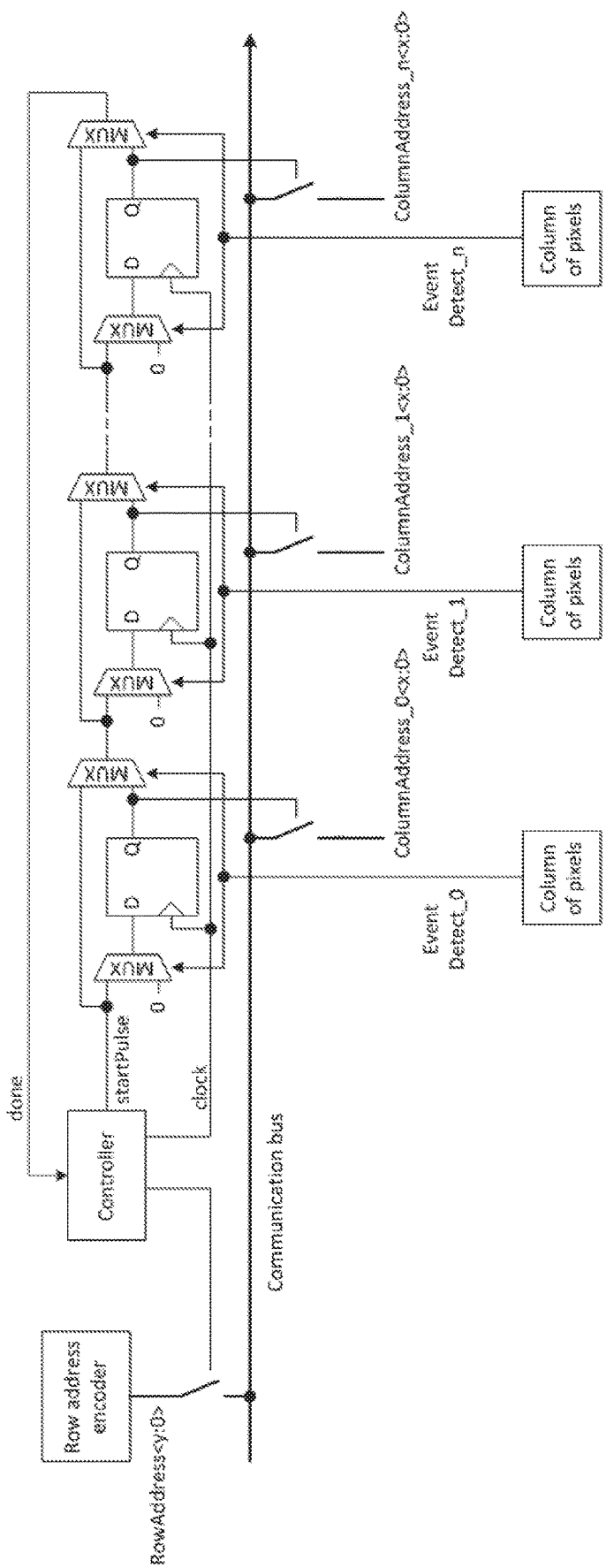
FIG. 8 is a schematic diagram showing an implementation of an event-based column readout that is preferably used in a pixel array with digital readout.

The event-based column readout circuit embodiment shown in FIG. 8 allows reading out the addresses of those pixels where the comparator output indicates a Vdiff above or below a given threshold ("EventDetect"). For this, the array is either scanned column-by-column and within each column, row-by-row or in a column-parallel fashion such that only a scan through all rows is necessary. Whenever an "event" is detected, the according column and row addresses as well as potential further information is encoded and sequentially communicated onto a shared readout bus.

A pixel array according to the present invention may comprise a column readout circuit which consists of a shift register, where each shift register stage can be bypassed depending on the output of a comparator in a pixel.

The column-parallel readout implementation consists of a shift register. Each column of pixels has one corresponding shift register stage. Each shift register stage can be bypassed. The bypass is controlled by the EventDetect output (which depends on the comparator output in the pixel) of the pixel.

If the EventDetect output is low, the shift register stage is bypassed. If the EventDetect output is high, the shift register stage is not bypassed.

The controller starts the readout of the events by setting startPulse high and pulsing the clock. Afterwards the controller sets startPulse low again. The first shift-register stage that is NOT bypassed (e.g., where the corresponding EventDetect is high) will have stored a high voltage level at its output. This connects the Address of the corresponding column to the communication bus. The receiver can now read this address. At the next pulse of clock, the high level will move to the next shift register stage which is not bypassed, and the corresponding address is connected to the communication bus. This continues until the high level moves to the last shift register stage that is not bypassed. The output of this stage will signal the controller that readout has finished for this row. The controller can now activate the RowSelect signal for the next row, connect the row address encoder to the communication bus and afterwards restart the shift register by setting startPulse high.

Figure 9:
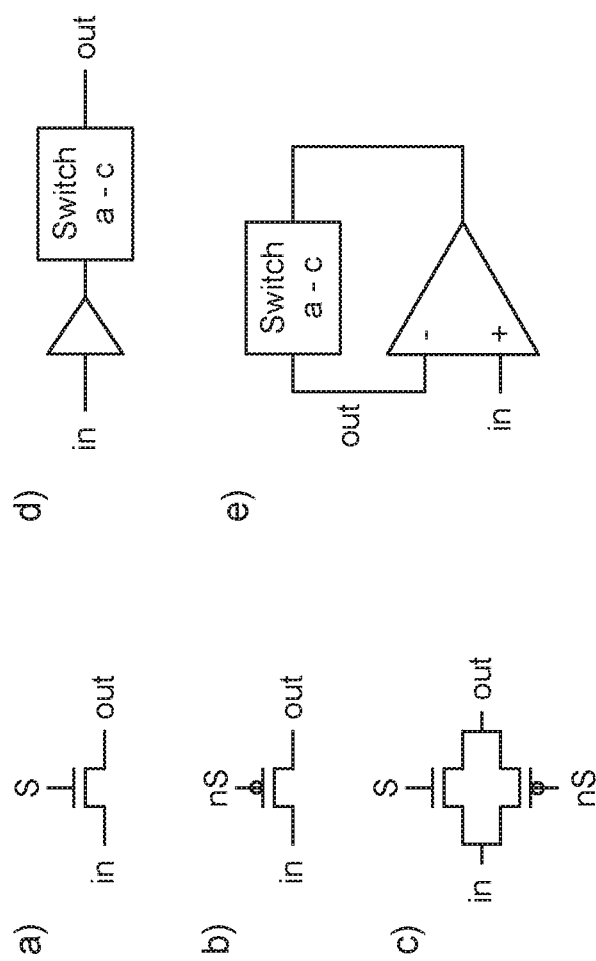
FIG. 9 is a schematic diagram showing different reset and sampling circuit implementations that may be used in each pixel of the array.
Figure 10:
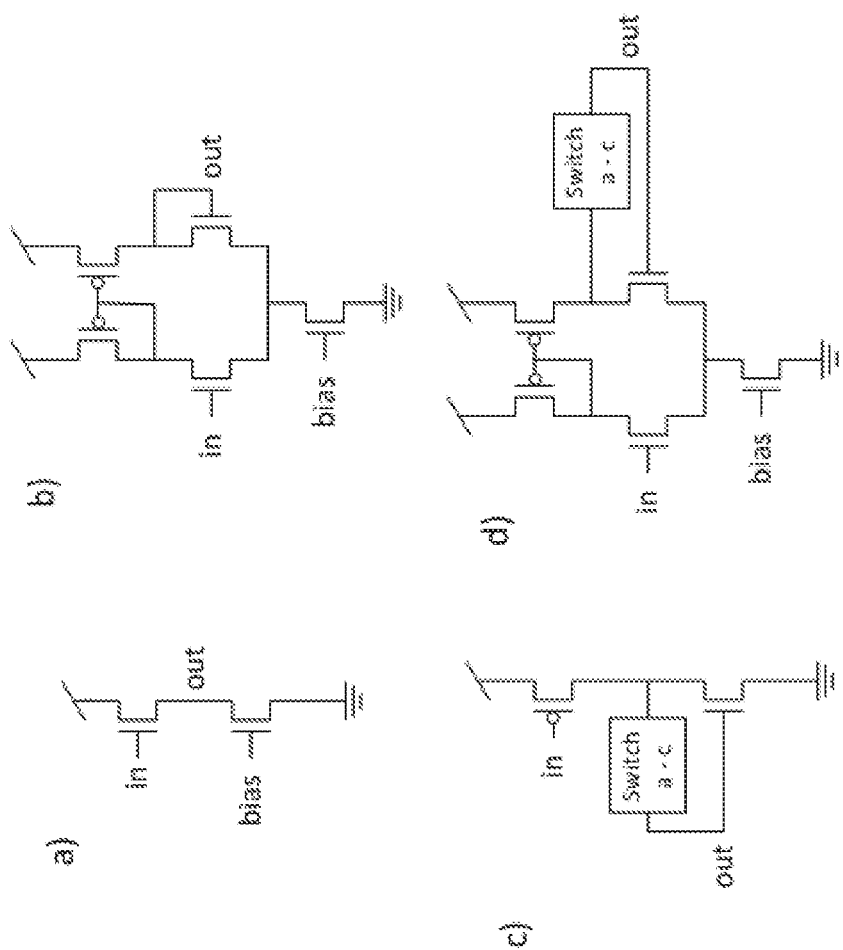
FIG. 10 includes circuit diagrams showing different buffer circuit implementations that may be used in each pixel of the pixel array.

FIG. 9 shows reset (RS) and sampling circuit embodiments (S1). In the figure S denotes switch signal and nS denotes inverted switch signal. Implementations in FIGS. 9d and 9e require switches shown in FIGS. 9a-9c.

The circuits for sampling the photoreceptor signal and for resetting the capacitor may be implemented in pixel array embodiments of the present invention in many different ways depending on the design constraints. The reset circuit and the sampling circuit may include a NFET transistor, a PFET transistor, a full transmission gate, a buffer and a switch (FIGS. 9a-9d) and an amplifier with a switch (FIG. 9e) in feedback configuration.

Some of these example reset and sampling circuits are directed circuits such that the two terminals are distinct. Therefore it is preferably that the driven terminal (out) is connected to the capacitor.

In the case of the sampling circuit S1, the switch signal S1 is the sampling signal which, when active, connects the output of the photoreceptor to the first terminal of the capacitor.

In the case of the reset circuit, the switch signal is the reset signal RS which when active connects the reset voltage Vres to the second terminal of the capacitor.

The full transmission gate implementation (FIG. 9c) preferably has an inverted version of the switch signal which can be generated locally in the pixel or globally outside of the pixel array.

In case of implementations FIGS. 9d and 9e, the input and output of the sampling circuit are connected via a buffer. If FIG. 9e, for example, is used as a reset circuit, the electronic connection between the reset voltage and the second terminal of the capacitor is given by the amplifier being in unity gain configuration, driving the second terminal of the capacitor to the reset voltage.

A pixel according to the preferred embodiment of the pixel array (FIG. 17) uses implementation of FIG. 9e for the reset circuit and implementations of FIG. 9a, 9b or 9d for all other sampling circuits.

The buffer in FIG. 9d can be implemented as a source follower (FIG. 10a) if a voltage offset can be tolerated; otherwise it can be implemented as a 5-transistor buffer in unity gain mode (FIG. 10b). The amplifier in implementation FIG. 9e can be implemented as common source amplifier (FIG. 10c) if a voltage offset can be tolerated; otherwise a 5-transistor differential amplifier (FIG. 10d) can be used.

The pixel array embodiment of the present invention may comprise a controller. The controller preferably generates the necessary waveforms of the switch signals to the pixel and controls the voltage at the first input of the comparators and generates the necessary waveforms to control the readout circuit.

The controller can be integrated on the same sensor integrated circuit (IC) as the pixel array or in a separate IC using for example a microcontroller or a field programmable gate array (FPGA). The controller can be implemented by a finite state machine or using a microcontroller core.

The controller may be implemented as a software code in some implementations.

Sensor embodiments for temporal redundancy computation are discussed next.

FIGS. 11-15 illustrate a pixel array according to a further embodiment of the present invention. The pixel array in FIGS. 11-15 comprises one or more pixels although only one pixel 100 is illustrated. The pixel comprises:

1. A photodiode, a photoreceptor and a capacitor (C1) as discussed before.

2. A first sampling circuit that allows connecting said photoreceptor voltage to the first terminal of the capacitor using a sampling signal S1 shared among all pixels of the array.

3. An amplifier A1, where the first input is connected to the second terminal of the capacitor and where the second input is connected to a voltage source.

4. An output circuit OUT that allows reading the output of the amplifier.

5. Finally, a reset circuit that allows connecting the second terminal of said capacitor to the output of the amplifier using a reset signal RS.

To compute temporal changes, the photoreceptor output is first sampled as a reference value against a reset voltage. At a later point in time the photoreceptor voltage is sampled for a second time to get the signal voltage and the according change with respect to the reference voltage. In the case of a logarithmic photoreceptor, changes of the photoreceptor voltage (and thus the pixel output) correspond to temporal contrast; in case of a linear photoreceptor, the pixel output corresponds to temporal difference.

If all the pixels are reset after reading out the pixel values, the pixel performs a frame-to-frame difference computation. The according output is thereby dependent on the sampling and reset rate. A high sampling rate results in a high temporal resolution but the high reset rate results in a high-pass filtering of the input. In many tracking applications though, it is preferable to have a high temporal resolution without high-pass filtering so that structures can be tracked independent of their velocity. Therefore it is preferable to sample at a high rate and to reset the pixel (i.e. sample the reference voltage) only after the pixel actually experienced sufficient change. Such a conditional reset is performed such that a new reference voltage is only sampled in case the difference between the latest sampled voltage and the reference voltage exceeds a threshold.

In an analog readout mode, the changes between the reference voltage and the latest sampled voltage are directly read out as an image.

In a digital readout mode, the pixel produces an output only if the difference with respect to the reference voltage exceeds a threshold voltage. To detect negative and positive temporal contrast (i.e. pixels getting darker or brighter), the second terminal of the capacitor may be compared against two voltages, one lower and one higher than the reset voltage. The time between sampling of the reference illumination and the threshold crossing is a measure of the rate of illumination change.

Figure 11:
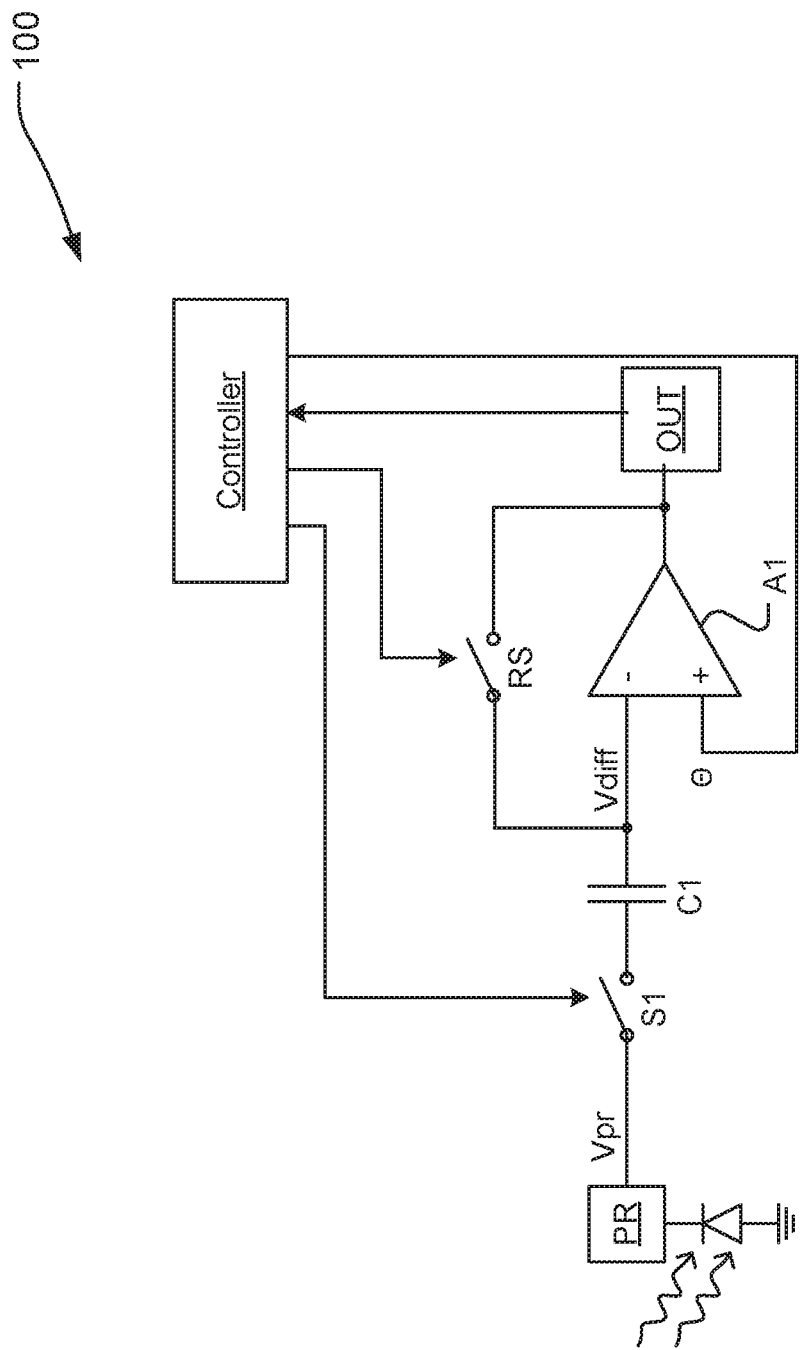
FIG. 11 is a circuit diagram showing a pixel array with one pixel for temporal contrast computation.
Figure 12:
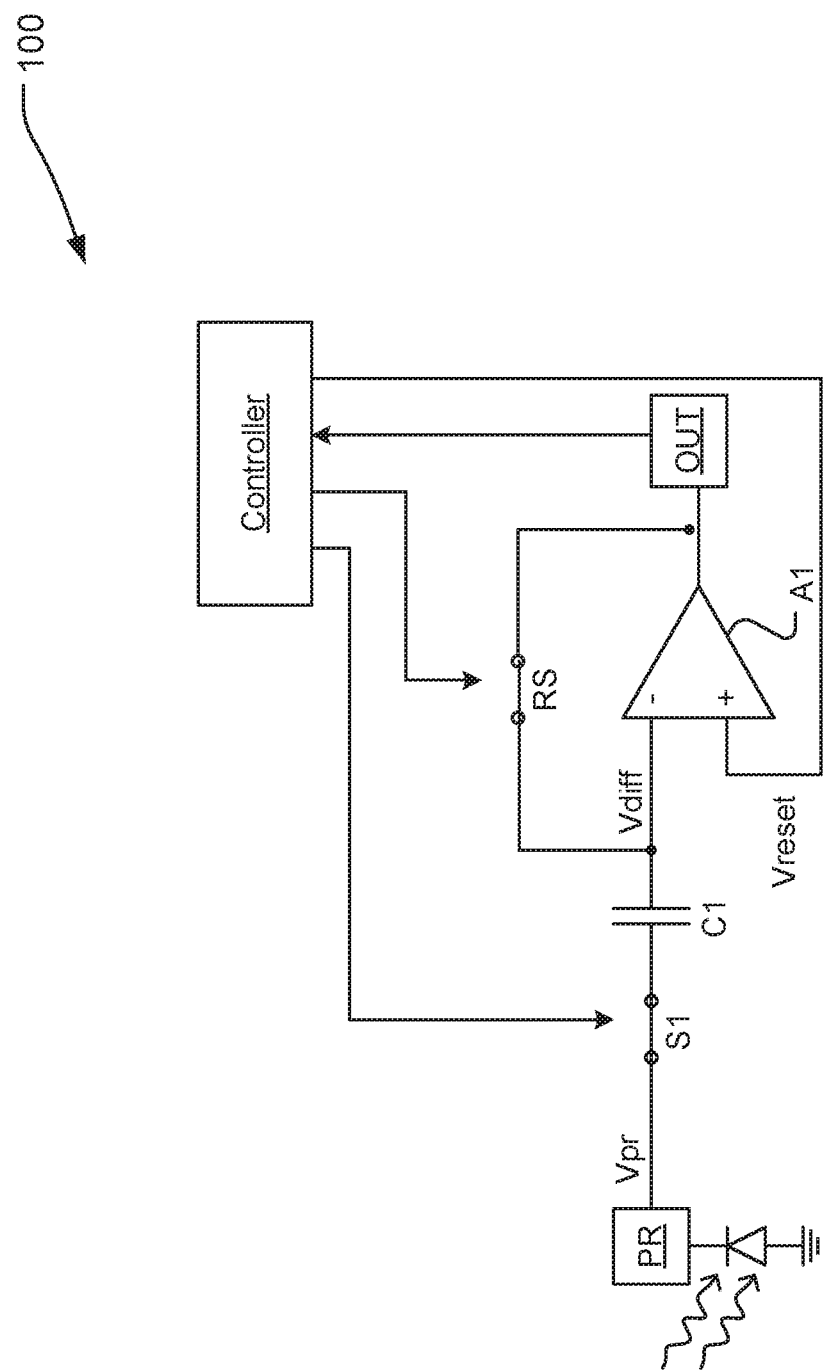
FIG. 12 is a circuit diagram showing a pixel array with one pixel for temporal contrast computation, where the switches in the pixel are in the reset-state.
Figure 13:
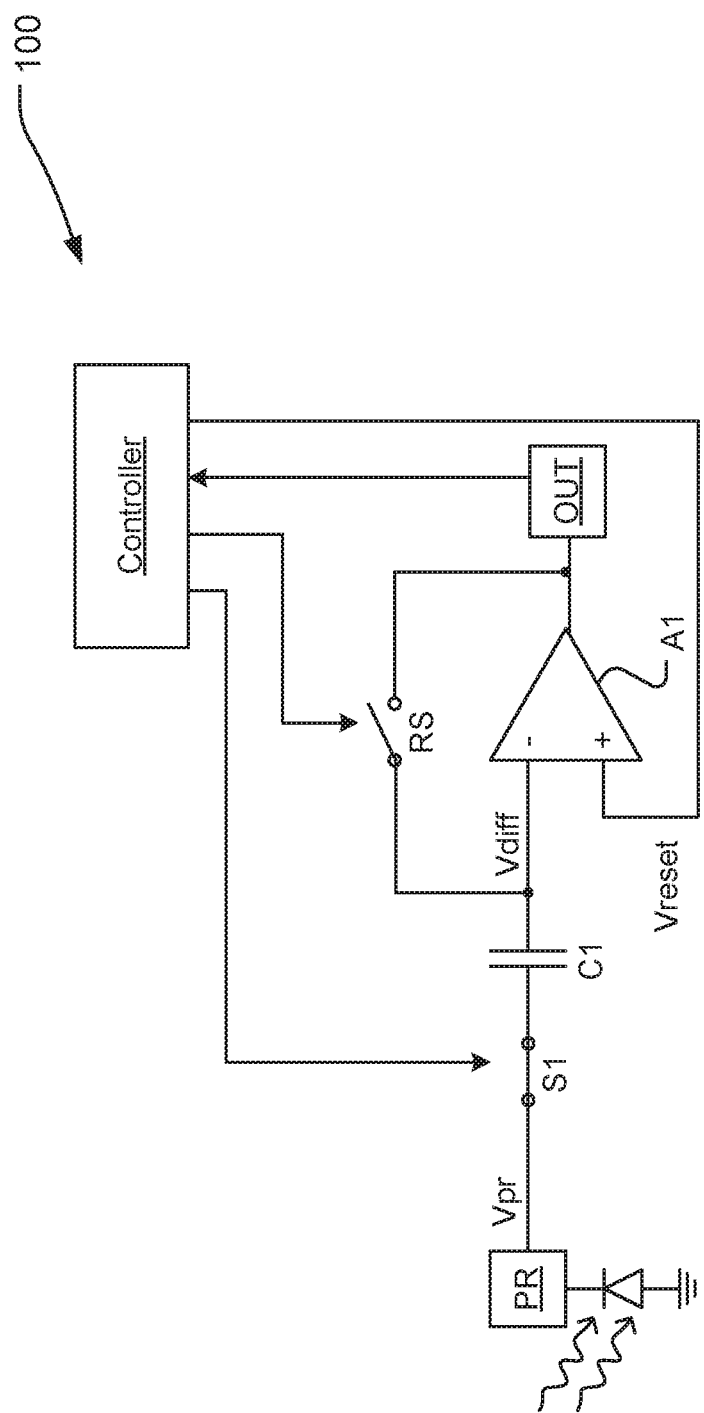
FIG. 13 is a circuit diagram showing a pixel array with one pixel for temporal contrast computation, where the switches in the pixel are in the update-state.
Figure 14:
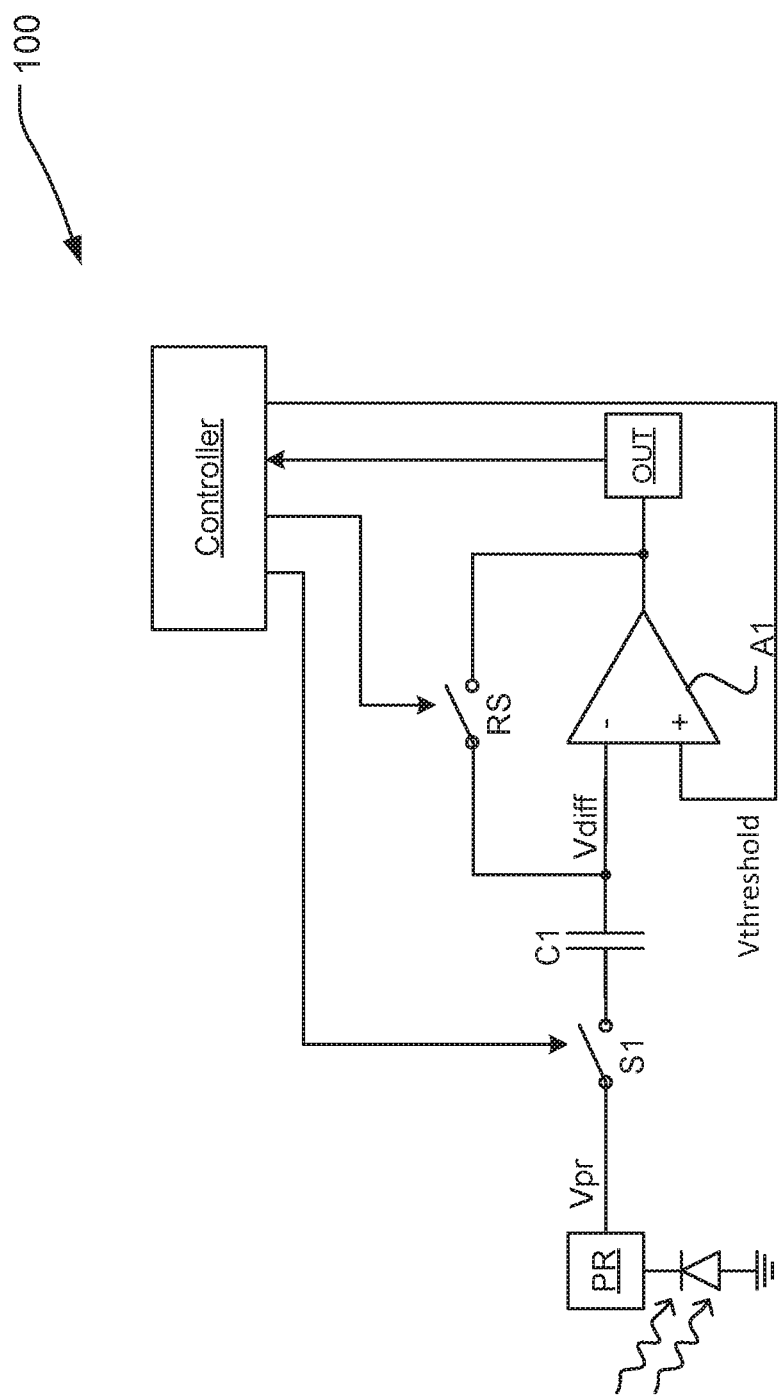
FIG. 14 is a circuit diagram showing a pixel array with one pixel for temporal contrast computation, where the switches in the pixel are in the comparison-state.
Figure 15:
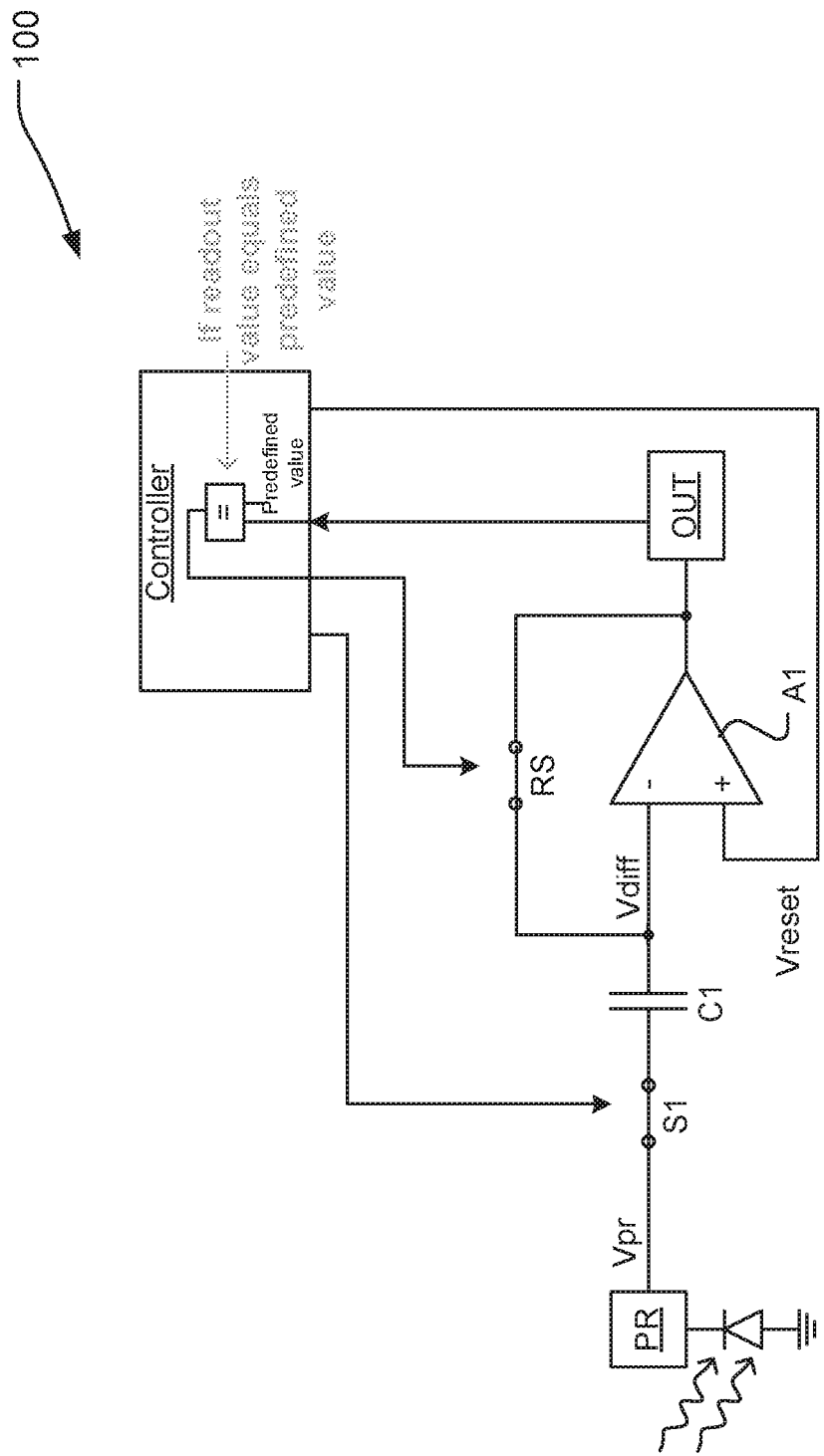
FIG. 15 is a circuit diagram showing a pixel array with one pixel for temporal contrast computation, where the switches in the pixel are in the conditional reset-state.

FIG. 11 shows the circuit for temporal contrast computation. There is a connection from the output OUT to the controller, which is needed for digital readout of temporal contrast, because in this mode the reset happens depending on the output that has been read from this pixel.

In case of analog readout, the sequence for temporal contrast operation is as follows (the different states are shown in FIGS. 12-15): 1. Reset pixel (FIG. 12): The current illumination value is sampled across the capacitor C1. To do this the controller closes RS and S1 and applies Vreset to the positive input of the amplifier.

2. (FIG. 11) The controller opens both RS and S1.

3. Update (FIG. 13): After a delay, the controller closes S1 again, but with RS open. This means the voltage across the capacitor does not change. As a result if Vpr changes, Vdiff will differ from the reset value Vreset.

4. The controller opens S1. (FIG. 11)

5. Readout: The value of Vdiff (or an amplified version of it) is conveyed to the periphery.

6. Repeat steps 2 to 5.

In case of digital readout, the amplifier may be used as a comparator, or a comparator may be used instead of the amplifier. The sequence for temporal contrast operation is as follows (the different states are shown in FIGS. 12-15):

1. Reset pixel (FIG. 12): Current illumination value is sampled across the capacitor C1. To do this the controller closes RS and S1 and applies Vreset to the positive input of the amplifier.

2. The controller opens both RS and S1 (FIG. 11).

3. Update (FIG. 13): After a delay, the controller closes S1 again, but without closing RS. This means the voltage across the capacitor does not change. As a result if Vpr changes, Vdiff will differ from the reset value Vreset.

4. The controller opens S1 (FIG. 11).

5. Readout (FIG. 14): Vdiff is compared to at least one threshold, and the amplifier output is sent to the periphery. To do the comparison, the controller applies a threshold voltage Vthreshold to the positive input of the amplifier. Vdiff can be compared to two thresholds, one that is higher than Vreset to detect increasing light intensity, a second one that is lower than Vreset to detect decreasing light intensity.

6. Conditional reset (FIG. 15): In case of the digital readout, if a change in light intensity has been detected (the amplifier output is equal to a predefined value), the pixel is again reset. This means the controller closes S1 and RS and applies Vreset to the positive input of the amplifier.

7. Repeat steps 2 to 6.

Thus, in case of digital readout, except for the startup of the sensor, the pixels in the array are not all reset at the same moment. Each pixel is reset when a sufficiently large change has been detected at this pixel.

A numerical example is given below.

Assume that Vreset=1V, Vthreshold=2V, initially Vpr=2V.

Reset: Corresponding to step 1 above, both S1 and RS are closed, thus Vdiff is equal to Vreset and the voltage across the capacitor is VC1=Vpr−Vreset=1V.

Corresponding to step 2 above, both switches are opened. We assume that the light intensity increases a bit, and thus Vpr changes to 2.5V.

Corresponding to step 3 above, after a delay S1 is closed again. The voltage across C1 stays constant (because the charge cannot go anywhere), so Vdiff increases to Vpr−VC1=1.5V.

Corresponding to step 4 above, S1 is opened.

Corresponding to step 5 above, Vdiff is compared to the threshold. Vdiff is smaller than the threshold, so the change in Vpr has not been detected.

In this numerical example, we assume that now the light intensity increases even more, and Vpr increases to 3.2V.

Corresponding to step 3 above, after a delay S1 is closed again. The voltage across C1 stays constant (because the charge cannot go anywhere), so Vdiff increases to Vpr−VC1=2.2V.

Corresponding to step 4 above, S1 is opened.

Corresponding to step 5 above, Vdiff is compared to the threshold. Vdiff is bigger than the threshold, so the change in Vpr has been detected.

Corresponding to step 6 above, because a change has been detected, the conditional reset is operated: Both S1 and RS are closed, thus Vdiff is equal to Vreset and the voltage across the capacitor is now VC1=Vpr−Vreset=2.2V.

Figure 16:
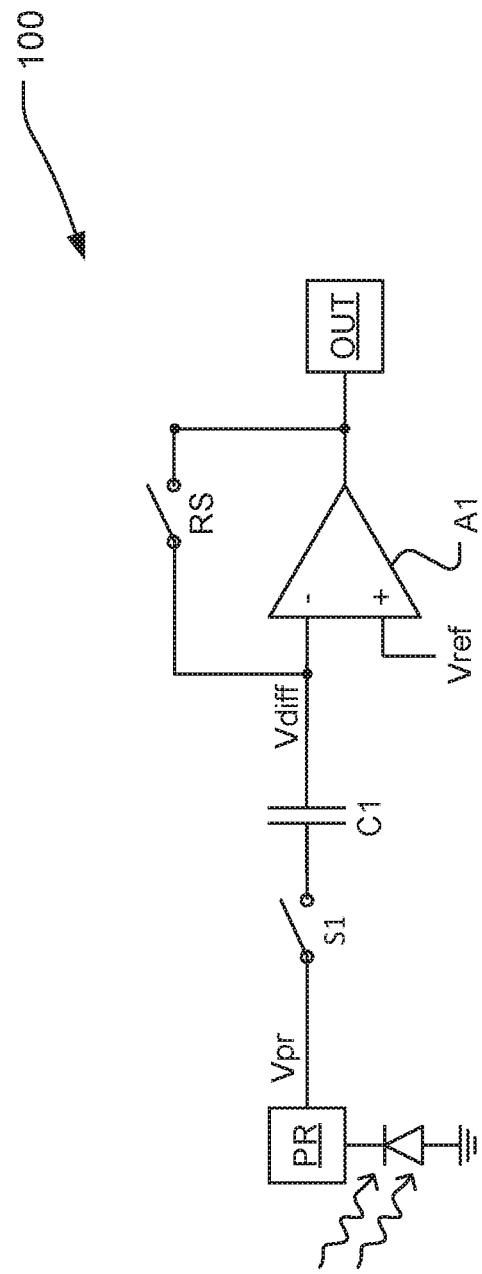
FIG. 16 is a circuit diagram showing a preferred pixel circuit embodiment in a block level diagram.

FIG. 16 shows the preferred embodiment of a pixel circuit, at a block level, according to the present invention. The component blocks are:

1. A photodiode which can convert light which is incident on the photodiode into a current, wherein the amplitude of said current is proportional to the intensity of the light.

2. A photoreceptor which is connected to the photodiode so that the photoreceptor can receive said current from the photodiode, and wherein the photoreceptor is configured such that it can convert said current which it receives from the photodiode into a photoreceptor voltage.

3. A first capacitor (C1).

4. A first sampling circuit (S1) that allows connecting said photoreceptor voltage to the first terminal of the first capacitor using a sampling signal S1 shared among all pixels.

5. An amplifier, where the first input is connected to the second terminal of the first capacitor and where the second input is connected to a reference voltage source (Vref).

6. An output circuit OUT that allows reading the output of the amplifier.

7. A reset circuit that allows connecting the second terminal of said first capacitor to the output of the amplifier using a reset signal RS.

Figure 17:
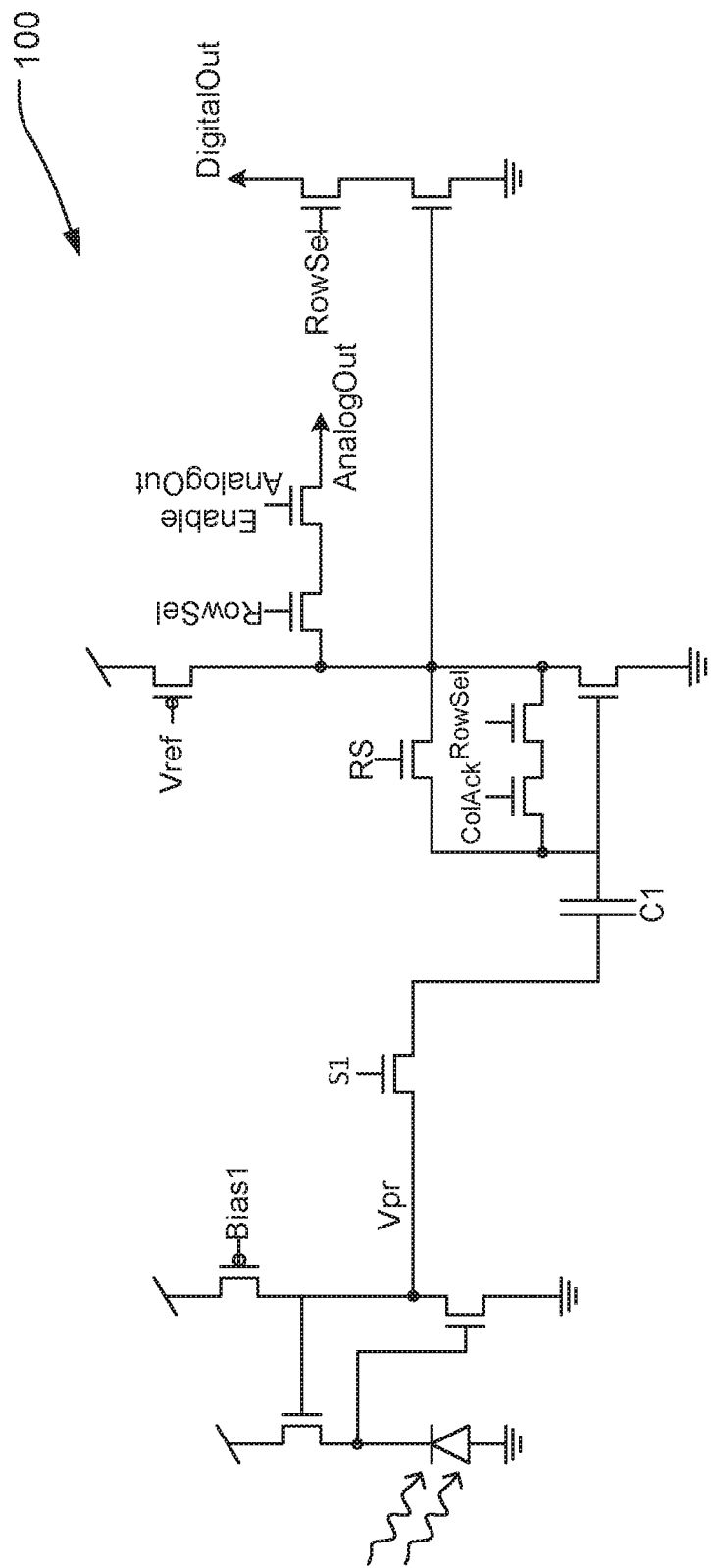
FIG. 17 is a circuit diagram showing a preferred pixel circuit embodiment in a transistor level diagram.

FIG. 17 shows a transistor level circuit that implements the preferred embodiment. As a photoreceptor, a logarithmic circuit is used. The amplifier is implemented as a 2-transistor common source amplifier; the switches are single transistor switches without buffers.

The reset switch RS is used for global reset (intensity mode, spatial contrast), while two series connected transistors are used for the conditional reset needed for temporal contrast. The ColAck signal is calculated column-wise and is only active for those pixels, where a reset should be effectuated (i.e., when a light intensity change has been detected). The pixel is reset when both ColAck and RowSel are logic high.

Figure 18:
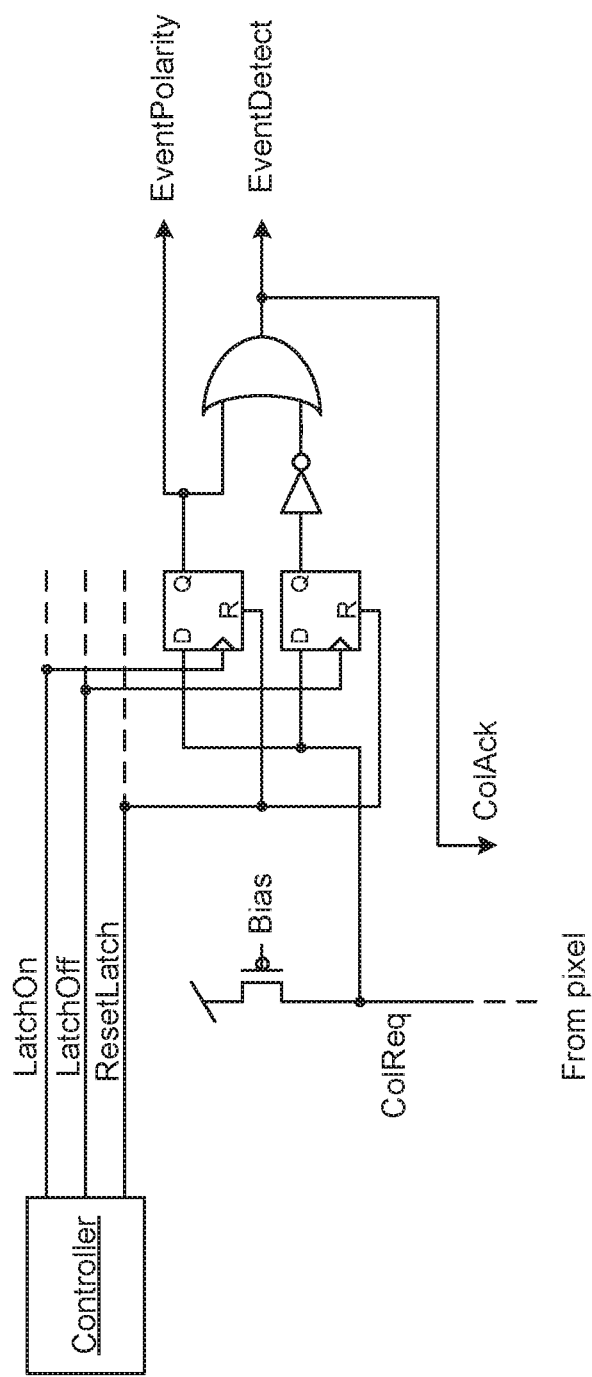
FIG. 18 is a circuit diagram showing an implementation of column logic that allows conditional reset for digital readout.

FIG. 18 shows a circuit (which would be part of the readout circuit or the controller) that allows the conditional reset for the temporal contrast operation. It generates a signal that goes to the pixel and in conjunction with the RowSelect signal resets the pixel after detection of an intensity change. In the proposed embodiment, this ColAck signal is equal to an EventDetect signal that flags an intensity change.

An intensity change is detected when the request line ColReq is high when the first threshold is applied to the pixel comparator, or when the request line is low when the second threshold is applied to the pixel comparator.

While this invention has been particularly shown and described with references to preferred embodiments thereof, it will be understood by those skilled in the art that various changes in form and details may be made therein without departing from the scope of the invention encompassed by the appended claims.

What is claimed is:

1. A sensor comprising,
one or more pixels, each of the one or more pixels comprising: a photodiode which can convert light which is incident on the photodiode into a current, wherein the amplitude of said current is proportional to the intensity of the light, a photoreceptor circuit which is connected to the photodiode so that the photoreceptor circuit can receive said current from the photodiode, and wherein the photoreceptor circuit is configured such that it can convert said current which it receives from the photodiode into a voltage and to output that voltage as an output of the photoreceptor, a capacitor having a first and second terminal, and a first sampling circuit which is provided between the output of the photoreceptor and the first terminal of the capacitor and which is configured such that it can be selectively operated to, electronically connect the first terminal of the capacitor to the voltage output of the photoreceptor, or, to provide an open circuit between the first terminal of the capacitor and the voltage output of the photoreceptor, a reset circuit which is configured such that it can be selectively operated to, electronically connect the second terminal of the capacitor to a first voltage source which can provide a predefined reference voltage, or, to provide an open circuit between the second terminal of the capacitor and said first voltage source.

2. The sensor according to claim 1 further comprising a controller which is configured to operate the first sampling circuit and the reset circuit, in the following sequence:
first, operate the first sampling circuit so that the first terminal of the capacitor is electronically connected to the voltage output of the photoreceptor;
second, while the first terminal of the capacitor is electronically connected to the voltage output of the photoreceptor, consecutively operate the reset circuit so that the reset circuit electronically connects the second terminal of the capacitor to the first voltage source and, then operate the reset circuit so that the reset circuit provides an open circuit between the second terminal of the capacitor and the first voltage source.

3. The sensor according to claim 2, wherein said controller is further configured to operate the reset circuit so that the reset circuit electronically connects the second terminal of the capacitor to the first voltage source for a second time, if after the controller has operated the reset circuit so that the reset circuit provides an open circuit between the second terminal of the capacitor and the first voltage source, the absolute value of the voltage at the second terminal of the capacitor is above a predefined absolute value or below a second predefined absolute value.

4. The sensor according to claim 1, wherein
the first sampling circuit comprises a switch which can be selectively closed so as to connect the capacitor to the voltage output of the photoreceptor, or opened so as to provide an open circuit between the first terminal of the capacitor and the voltage output of the photoreceptor; and the reset circuit comprises a switch which can be selectively closed so as to electronically connect the second terminal of the capacitor and the first voltage source, or opened so as to provide an open circuit between the second terminal of the capacitor and the first voltage source.

5. The sensor according to claim 1, further comprising an amplifier which has a first input and a second input, wherein the first voltage source is electrically connected to the first input of the amplifier and the reset circuit is electrically connected to an output of the amplifier.

6. The sensor according claim 5 wherein the reset circuit is further electrically connected to the second input of the amplifier, so that the reset circuit is electrically connected between the first input of the amplifier and the output of the amplifier.

7. The sensor according to claim 5, comprising a controller which is configured to:
first, operate the first sampling circuit so that the first terminal of the capacitor is electronically connected to the voltage output of the photoreceptor, and, operate the reset circuit so that the reset circuit electronically connects the second terminal of the capacitor to the first voltage source;
second, operate the first sampling circuit so that the first sampling circuit provides an open circuit between the first terminal of the capacitor and photoreceptor, and, operate the reset circuit so that the reset circuit provides an open circuit between the second terminal of the capacitor and the first voltage source;
third, operate the first sampling circuit so that the first terminal of the capacitor is electronically connected to the voltage output of the photoreceptor, and, operate the reset circuit so that the reset circuit provides an open circuit between the second terminal of the capacitor and the first voltage source; and
fourth, operate the first sampling circuit so that the first sampling circuit provides an open circuit between the first terminal of the capacitor and photoreceptor, and, operate the reset circuit so that the reset circuit provides an open circuit between the second terminal of the capacitor and the first voltage source, and wherein the controller is further configured to apply a threshold voltage to the first input of the amplifier, when the first sampling circuit is operated to provide an open circuit between the first terminal of the capacitor and photoreceptor and the reset circuit is operated to provide open circuit between the second terminal of the capacitor and the first voltage source.

8. The sensor according to claim 7, wherein the controller is further configured to read a value output by the amplifier when the threshold voltage is applied to the first input of the amplifier, and to operate the reset circuit so that the reset circuit electronically connects the second terminal of the capacitor to the first voltage source if the output of the amplifier is within a predefined range.

9. The sensor according to claim 7, comprising a plurality of said one or more pixels, and wherein the controller is configured to, for all of the plurality of pixels simultaneously:
first, operate first sampling circuits so that a first terminal of respective capacitors are electronically connected to the respective voltage outputs of the photoreceptors, and, operate the reset circuits so that the reset circuits electronically connect the respective second terminals of the respective capacitors to the first voltage source;
second, operate the first sampling circuits so that the first sampling circuits provide an open circuit between the respective first terminal of the respective capacitors and the respective photoreceptors, and, operate the reset circuits so that the reset circuits provide an open circuits between the respective second terminals of the respective capacitors and the first voltage source; and
third, operate the first sampling circuits so that the respective first terminals of the respective capacitors are electronically connected to the voltage output of the respective photoreceptor, and, operate the reset circuits so that the reset circuits provide an open circuit between the respective second terminal of the respective capacitor and the first voltage source; and
fourth, operate the first sampling circuits so that the first sampling circuits provide an open circuit between the respective first terminals of the respective capacitors and the respective photoreceptors, and, operate the reset circuits so that the reset circuits provide an open circuit between the respective second terminals of the respective capacitors and the first voltage source, and wherein the controller is further configured to apply a threshold voltage simultaneously to first inputs of all of amplifiers of all of said pixels, when the first sampling circuits are operated to provide an open circuit between the respective first terminals of the respective capacitors and the respective photoreceptors and the reset circuits are operated to provide an open circuit between the respective second terminals of the respective capacitors and the first voltage source.

10. The sensor according to claim 9 wherein the controller is further configured to read a value output by respective amplifiers when the threshold voltage is applied to the first inputs of the respective amplifiers, and to simultaneously operate the reset circuits of only those pixels in which the value output by the amplifier of that pixel is within a predefined range, so that the reset circuit of that pixel electronically connects the second terminal of the capacitor of that pixel to the first voltage source.

11. The sensor according to claim 1, further comprising a read-out circuit, which is configured such that it can be selectively operated to output from a pixel a voltage at the second terminal of the capacitor.

12. The sensor according to claim 5, further comprising a read-out circuit, which is configured such that it can be selectively operated to output to a processor, a voltage at the output of the amplifier.

13. The sensor according to claim 5, wherein each of the pixels have an address unique to addresses of said other pixels, and wherein a read-out circuit, is configured such that it can be selectively operated to output to a processor, the addresses of those pixels which have a voltage at the output of the amplifier which is within a predefined range.

14. The sensor according to claim 1, further comprising a controller which is configured to simultaneously operate the first sampling circuit of all of the plurality of pixels so that first terminals of respective capacitors are simultaneously electronically connected to the voltage output of respective photoreceptors.

15. The sensor according to claim 14, wherein the controller is further configured to, while the first terminals of the respective capacitors are electronically connected to the voltage output of respective photoreceptors, simultaneously operate respective reset circuits of all of said plurality of said one or more pixels, so that the respective reset circuits consecutively electronically connect a second terminal of the respective capacitors to the first voltage source, and, then provide an open circuit between the second terminal of the respective capacitors and the first voltage source.

* * * * *